United States Patent
Qiu et al.

(10) Patent No.: US 11,822,098 B2
(45) Date of Patent: Nov. 21, 2023

(54) QUANTUM DOT LENS, BACKLIGHT MODULE, DISPLAY DEVICE AND MANUFACTURING METHOD OF QUANTUM DOT LENS

(71) Applicant: NANTONG VEEYEE NEW MATERIAL TECHNOLOGY CO., LTD, Nantong (CN)

(72) Inventors: Xiaohua Qiu, Nantong (CN); Chong Wan, Nantong (CN); Haiyan Wei, Nantong (CN)

(73) Assignee: NANTONG VEEYEE NEW MATERIAL TECHNOLOGY CO., LTD, Nantong (CN)

( * ) Notice: Subject to any disclaimer, the term of this patent is extended or adjusted under 35 U.S.C. 154(b) by 74 days.

(21) Appl. No.: 17/642,245

(22) PCT Filed: Sep. 13, 2021

(86) PCT No.: PCT/CN2021/117954
§ 371 (c)(1),
(2) Date: Mar. 11, 2022

(87) PCT Pub. No.: WO2022/062938
PCT Pub. Date: Mar. 31, 2022

(65) Prior Publication Data
US 2022/0365250 A1   Nov. 17, 2022

(30) Foreign Application Priority Data
Sep. 26, 2020 (CN) .......................... 202011027170.0

(51) Int. Cl.
*G02B 3/00* (2006.01)
*G02B 1/00* (2006.01)
*G02F 1/1335* (2006.01)

(52) U.S. Cl.
CPC ............. *G02B 3/0031* (2013.01); *G02B 1/00* (2013.01); *G02B 3/0012* (2013.01); *G02F 1/133614* (2021.01)

(58) Field of Classification Search
CPC ............ G02F 1/133614; G02B 3/0012; G02B 3/0031
See application file for complete search history.

(56) References Cited

U.S. PATENT DOCUMENTS

2013/0293123 A1* 11/2013 Deak, Sr. ............... H10K 59/90
977/774
2015/0247954 A1* 9/2015 Jeong ....................... G02B 1/00
264/2.7

FOREIGN PATENT DOCUMENTS

CN        1680090 A    10/2005
CN      101437764 A     5/2009
(Continued)

*Primary Examiner* — Arman B Fallahkhair
(74) *Attorney, Agent, or Firm* — Bayramoglu Law Offices LLC

(57) ABSTRACT

A quantum dot lens, a backlight module, a display device and a manufacturing method of the quantum dot lens are provided. The quantum dot lens includes: a first lens, which is a convex lens and is provided with a first lens surface; a second lens, which is a concave lens and is provided with a second lens surface opposite to the first lens surface; and a quantum dot fluorescent resin layer, provided between the first lens surface and the second lens surface, and including more than one quantum dot fluorescent material. With the above structure, the quantum dot lens has a simple manufacturing process and ease of mass production, saves the quantum dot fluorescent material, and solves the problems of poor consistency and blue light leakage of existing quantum dot lenses.

10 Claims, 2 Drawing Sheets

(56) References Cited

FOREIGN PATENT DOCUMENTS

| | | |
|---|---|---|
| CN | 101750703 A | 6/2010 |
| CN | 105444045 A | 3/2016 |
| CN | 107718819 A | 2/2018 |
| CN | 107946433 A | 4/2018 |
| CN | 109085689 A | 12/2018 |
| CN | 109128464 A | 1/2019 |
| CN | 109962149 A | 7/2019 |
| CN | 110165037 A | 8/2019 |
| CN | 110170742 A | 8/2019 |
| CN | 110491993 A | 11/2019 |
| CN | 210245548 U | 4/2020 |
| CN | 210429865 U | 4/2020 |
| CN | 111103722 A | 5/2020 |
| CN | 111240086 A | 6/2020 |
| CN | 112083520 A | 12/2020 |
| JP | S62206858 A | 9/1987 |

\* cited by examiner

QUANTUM DOT LENS, BACKLIGHT MODULE, DISPLAY DEVICE AND MANUFACTURING METHOD OF QUANTUM DOT LENS

CROSS REFERENCE TO THE RELATED APPLICATIONS

This application is the national phase entry of International Application No. PCT/CN2021/117954, filed on Sep. 13, 2021, which is based upon and claims priority to Chinese Patent Application No. 202011027170.0, filed on Sep. 26, 2020, the entire contents of which are incorporated herein by reference.

TECHNICAL FIELD

The present disclosure relates to backlight technologies of display devices, and in particular, to a quantum dot lens, a backlight module and display device including the quantum dot lens, and a manufacturing method of the quantum dot lens.

BACKGROUND

With the rapid development of backlight technologies and the constant emergence of new technologies and new products in the 21$^{st}$ century, light-emitting diode (LED) backlights have become predominant in the market, and quantum dot materials have been gradually appreciated. Particularly, quantum dot phosphors have received widespread attention in the LED backlight industry for a series of unique optical properties such as an adjustable spectrum with the size, a small full width at half maximum (FWHM), a small Stokes shift, a high excitation efficiency, and so on. However, existing quantum dot backlight modules typically have a sandwich structure with the quantum dot phosphors between two layers of barrier films, and need a large number of expensive quantum dot phosphors. Quantum dot lenses are implemented by coating the quantum dot phosphors or attaching fluorescent thin films, with poor uniformity and consistency of light rays, as well as frequent blue light leakage.

Backlight modules of display devices are classified into a direct type and an edge type. A direct type quantum dot backlight module mainly includes a white LED strip, a lens, a diffuser plate, a reflective film, a brightness enhancement film (BEF) and other optical films. The lens is configured to diffuse a point source of LED light as isotropic scattering light as much as possible to increase the divergence angle of the LED light. With the technological advances and the ever-increasing requirements of consumers, photoluminescent quantum dot materials present superior color rendering effects in liquid crystal displays (LCDs). Since the quantum dot materials are not resistant to high temperatures and water and are easily oxidized, methods for how to better solve failures of quantum dots and reduce the number of quantum dots to lower the cost will become mainstream research trends.

Existing quantum dot lenses are designed integrally, and are prepared by mixing quantum dot materials and lens materials for injection molding or stacked in a three-dimensional (3D) printing manner and coating a waterproof barrier layer on the surfaces of the quantum dot lenses. Nevertheless, the quantum dot lenses prepared by the above two methods are restricted by the poor water and oxygen resistance and the high manufacturing cost. The 3D printing method is low in efficiency and difficult for mass production. Due to isotropic light emitted from the excited quantum dots, existing quantum dot lenses have obvious defects such as low light extraction efficiency, undesirable light spot pattern and poor visual effect.

SUMMARY

In view of the above problems in the prior art, an objective of the present disclosure is to provide a quantum dot lens, a backlight module, a display device and a manufacturing method of the quantum dot lens. The present disclosure can keep light rays uniform and consistent, and effectively prevents the problems of low light extraction efficiency, blue light leakage and so on.

To achieve the above-mentioned objective, the present disclosure provides a quantum dot lens, including: a first lens, which is a convex lens and is provided with a first lens surface; a second lens, which is a concave lens and is provided with a second lens surface opposite to the first lens surface; and a quantum dot fluorescent resin layer, provided between the first lens surface and the second lens surface, and including more than one quantum dot fluorescent material.

In addition, preferably, the first lens surface of the first lens and the second lens surface of the second lens may be spaced apart at a fixed distance.

In addition, preferably, irregular concave and convex points may be arranged on the first lens surface and/or the second lens surface, and the irregular concave and convex points may be formed into at least one of a diffused micro-pyramid, a circular shape or an elliptical shape.

In addition, preferably, the first lens may include a lens portion and a lug boss under the lens portion, and a length of the lug boss may be greater than a length of the lens portion in a horizontal direction.

In addition, preferably, the second lens may include a lens body and a base, the base may be provided under the lens body, a recess may be formed in an underside of the base, and an opening may be formed in a portion of the recess corresponding to the second lens surface; and the lens portion of the first lens may be stretched into the second lens through the recess and the opening, and the lug boss of the first lens may be stretched into the recess.

In addition, preferably, a conical recess may be formed in an upside of the lens body of the second lens, and a surface of the conical recess may serve as a backlight outgoing surface.

In addition, the present disclosure further provides a backlight module, including: the above-mentioned quantum dot lens; and an LED light source under the first lens of the quantum dot lens.

In addition, the present disclosure further provides a display device, including: a display panel; the above-mentioned quantum dot lens; and an LED light source under the first lens of the quantum dot lens.

In addition, the present disclosure further provides a manufacturing method of the quantum dot lens, including: an injection molding step: performing high-temperature injection molding with a prefabricated mold and a specified optical resin material to respectively manufacture the first lens and the second lens; a laser etching step: performing laser etching on a portion where an upper surface of the lug boss of the first lens contacts a lower surface of the recess of the second lens to form overflow lines; a quantum dot fluorescent resin injecting step: coating, with the second lens surface of the second lens upward, an appropriate amount of liquid quantum dot fluorescent resin on the second lens surface; an encapsulating and pressure holding step: slowly pressing the lens portion of the first lens toward the second lens into the second lens through the recess and the opening, where air in a cavity between the first lens surface and the second lens surface is exhausted completely when the first lens is pressed into the second lens; and a photocuring step: irradiating assembled first lens and second lens with an ultraviolet (UV) light source to cure the liquid quantum dot fluorescent resin between the first lens surface and the second lens surface.

In addition, preferably, the manufacturing method may further include: a secondary encapsulating step: performing, after the photocuring step, irradiation with a first laser beam to form a molten pool on a surface of each of the first lens surface and the second lens surface in a laser operating region, where a spot area of the laser beam may be greater than a projection area of the second lens surface on the first lens; and performing irradiation with a second laser beam to further expand the molten pool, thus eliminating a gap, and volatilizing gas in the gap.

According to the present disclosure, the quantum dot fluorescent resin is encapsulated in the cavity between the first lens and the second lens. The contact surface where the cavity contacts the quantum dot fluorescent resin is a smooth lens surface or an optical surface having a special microstructure, which is helpful to keep light rays uniform and consistent from each angle after the quantum dot fluorescent material is excited, and to solve the problems of poor consistency, blue light leakage and so on of the existing quantum dot lenses. The quantum dot lens provided by the present disclosure has a simple manufacturing process and ease of mass production, and saves the quantum dot fluorescent material.

1. First lens; 11. lens portion; 12. lug boss; 13. first lens surface; 2. quantum dot fluorescent resin layer; 3. second lens; 31. conical recess; 32. second lens surface; 33. lens body; 34. base; 35. support; 36: recess; and 37: opening.

DETAILED DESCRIPTION OF THE EMBODIMENTS

The following embodiments described with reference to the accompanying drawings are intended to elaborate the advantages, features and implementations of the present disclosure. However, the present disclosure can be implemented in different forms, and should not be interpreted as limiting the embodiments herein. Rather, these embodiments are provided so that the present disclosure will be thorough and complete and will fully convey the scope of the present disclosure to a person skilled in the art.

Figure 1:
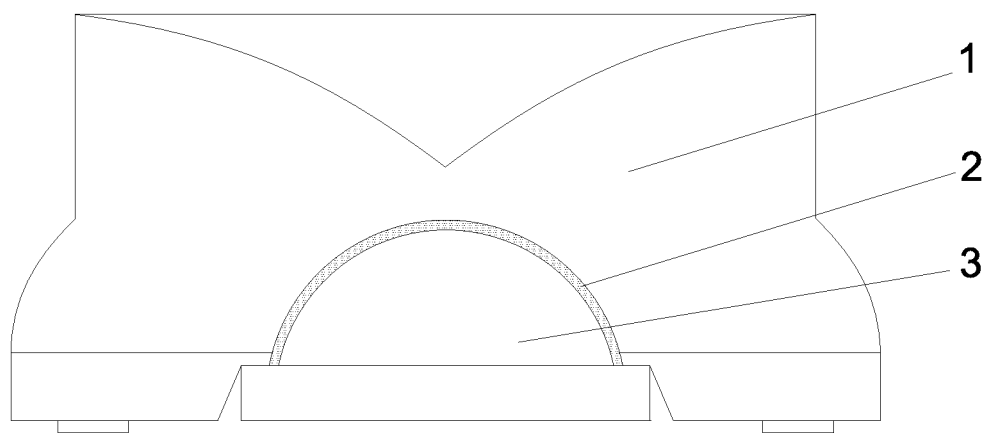
FIG. 1 is a schematic view illustrating a specific structure of a quantum dot lens according to the present disclosure.

FIG. 1 is a schematic view illustrating a specific structure of a quantum dot lens according to the present disclosure. As shown in FIG. 1, the quantum dot lens in the present disclosure includes a first lens 1, a second lens 3, and a quantum dot fluorescent resin layer 2 between the first lens 1 and the second lens 3. The first lens 1 is a convex lens and is provided with a first convex lens surface 13. The second lens 3 is a concave lens and is provided with a concave second lens surface 32.

Preferably, the first lens surface 13 of the first lens 1 and the second lens surface 32 of the second lens 3 are spaced apart at a fixed distance. Quantum dot fluorescent resin is provided in a cavity between the first lens surface 13 and the second lens surface 32 to form the quantum dot fluorescent resin layer 2. The quantum dot fluorescent resin includes more than one quantum dot fluorescent material that can be excited under irradiation of illuminating light. In addition, the first lens surface 13 of the first lens 1 and the second lens surface 32 of the second lens 3 may also be spaced apart at preset variable distances.

When the quantum dot lens is applied to the backlight module of the display device, illuminating light from an LED light source under the first lens 1 enters the first lens 1 of the quantum dot lens. After passing through the first lens 1, the illuminating light is emitted from the first lens surface 13 of the first lens 1 and enters the quantum dot fluorescent resin layer 2. When encountering the quantum dot fluorescent material in the quantum dot fluorescent resin layer 2, the illuminating light excites the quantum dot fluorescent material and appears the color corresponding to the quantum dot fluorescent material. The light then enters the second lens 2 through the second lens surface 32 and is emitted from an outgoing surface of the second lens 2 to form a backlight of the backlight module.

Figure 2:
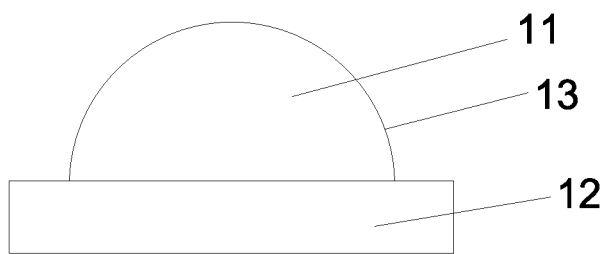
FIG. 2 is a schematic view illustrating a specific structure of a first lens in a quantum dot lens according to the present disclosure.

FIG. 2 is a schematic view illustrating a specific structure of a first lens in a quantum dot lens according to the present disclosure. As shown in FIG. 2, the first lens 1 used as the convex lens includes a lens portion 11 and a lug boss 12, the lens portion 11 is provided with the first lens surface 13, the lug boss 12 is provided under the lens portion 11, and a diameter of the lug boss 12 is greater than a maximum diameter of the lens portion 11 in a horizontal direction.

Figure 3:
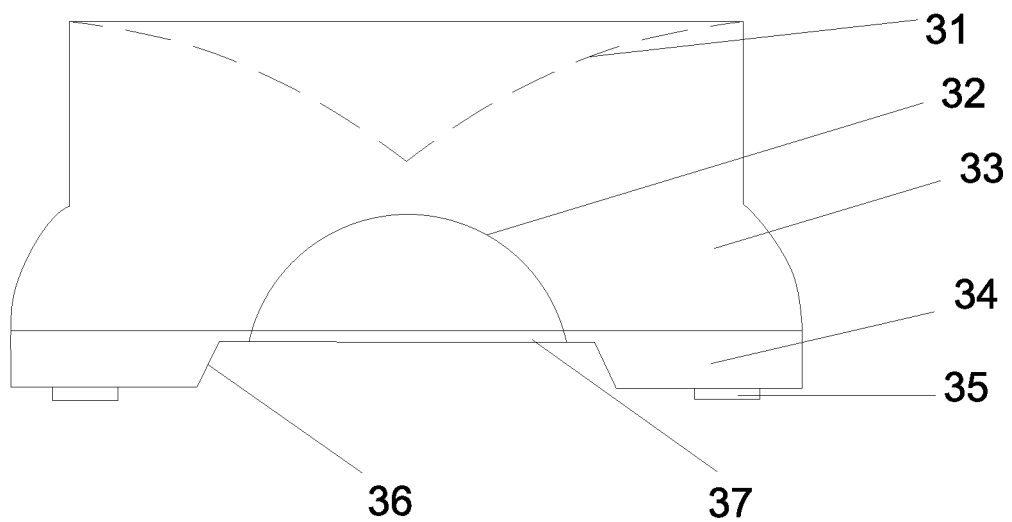
FIG. 3 is a schematic view illustrating a specific structure of a second lens in a quantum dot lens according to the present disclosure.

FIG. 3 is a schematic view illustrating a specific structure of a second lens in a quantum dot lens according to the present disclosure. As shown in FIG. 3, the second lens 3 of the concave lens includes a lens body 33 and a base 34, the lens body is provided with the concave second lens surface 32, the base 34 is provided under the lens body 33, and both the lens body and the base are made of a transparent material. In other embodiments, both the lens body and the base may also be integrally formed. A recess 36 is formed in an underside of the base 34. An opening 37 is formed in a portion of the recess 36 corresponding to the second lens surface 32, such that the lens portion 11 of the first lens 1 can be stretched into the second lens 3 through the recess 36 and the opening 37. The lug boss 12 of the first lens 1 can cooperate with the recess 36 for sealing.

In addition, multiple supports 35 may further be arranged at the periphery of the underside of the base 34. The supports 35 are configured to mount and fix the quantum dot lens. A conical recess 31 may be formed in an upside of the lens body 33, and a surface of the conical recess 31 serves as a backlight outgoing surface. However, the conical recess 31 may also be of other shapes, and may also be a planar backlight outgoing surface.

An overflow portion for overflowing the quantum dot fluorescent resin may further be provided on a portion where an upper surface of the lug boss 12 of the first lens 1 contacts a lower surface of the recess 36 of the second lens 3. For example, the overflow portion may be overflow lines respectively arranged on the upper surface of the lug boss 12 and the lower surface of the recess 36.

Herein, descriptions are made to the assembly process of the first lens 1 and the second lens 3. An appropriate amount of liquid quantum dot fluorescent resin is coated on the second lens surface 32 of the second lens 3. The appropriate amount means that the liquid quantum dot fluorescent resin can fill the cavity between the first lens 1 and the second lens 3 but is not overflown excessively to cause waste. The lens portion 11 of the first lens 1 toward the second lens 3 is stretched into the second lens 3 through the opening 37 of the second lens 3, until the upper surface of the lug boss 12 of the first lens 1 tightly contacts the lower surface of the recess 36 of the second lens portion 3. The first lens surface 13 of the first lens 1 and the second lens surface 32 of the second lens 3 are kept at a preset distance, such that the quantum dot fluorescent resin can fill the cavity between the first lens surface 13 and the second lens surface 32. As the upper surface of the lug boss 12 of the first lens 1 tightly contacts the lower surface of the recess 36 of the second lens portion 3, the overflow of the quantum dot fluorescent resin from the cavity is prevented. To ensure that no bubbles remain, the first lens 1 in the inserting process may be vibrated and/or rotated properly, such that tiny bubbles are separated out and are ejected along the overflow lines. The liquid quantum dot fluorescent resin in the cavity is cured by irradiating with UV light to form the solid quantum dot fluorescent resin layer 2. Therefore, the quantum dot lens is assembled completely.

In addition, preferably, the first lens surface 13 and/or the second lens surface 32 may be a smooth surface. The first lens surface 13 and/or the second lens surface 32 may also be an unsmooth surface, on which isotropic microstructures such as irregular concave and convex points in a diffused micro-pyramid, a circular shape or an elliptical shape are formed. The unsmooth surface can enhance the adhesion of the quantum dot fluorescent resin as well as the diffusion of the light.

In the above embodiment, the first lens and the second lens may be made of a glass material, organic glass, resin or other transparent optical materials.

A manufacturing method of the quantum dot lens in the present disclosure will be described below in detail.

Figure 4:
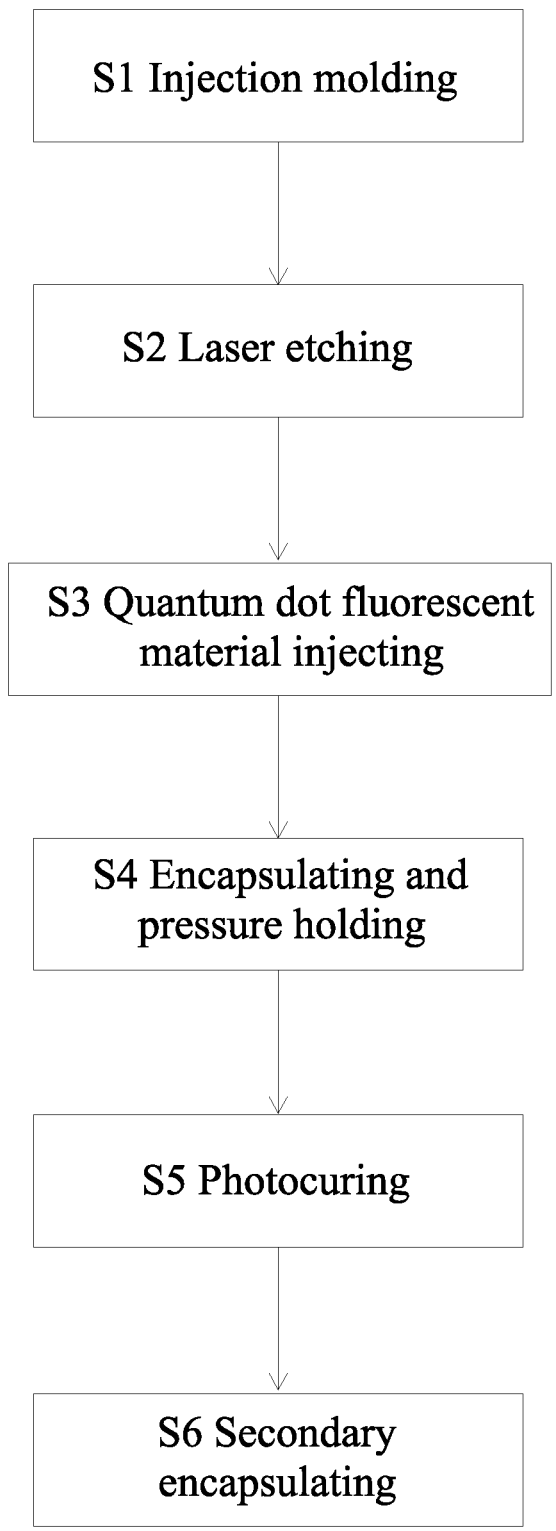
FIG. 4 is a flow chart of a manufacturing method of a quantum dot lens according to the present disclosure.

FIG. 4 is a flow chart of a manufacturing method of a quantum dot lens according to the present disclosure. As shown in FIG. 4, the method mainly includes a lens injection molding step S1, a laser etching step S2, a quantum dot fluorescent resin injecting step S3, an encapsulating and pressure holding step S4, and a photocuring step S5.

In the lens injection molding step S1, high-temperature injection molding is performed with a prefabricated mold and a specified optical resin material to respectively manufacture the first lens 1 and the second lens 3.

In the laser etching step S2, laser etching is performed on a portion where an upper surface of the lug boss 12 of the first lens 1 contacts a lower surface of the recess 36 of the second lens 3 to form overflow lines for overflowing quantum dot fluorescent resin.

In the quantum dot fluorescent resin injecting step S3, with the second lens surface 32 of the second lens 3 upward, an appropriate amount of liquid quantum dot fluorescent resin is coated on the second lens surface 32.

In the encapsulating and pressure holding step S4, the lens portion 11 of the first lens 1 toward the second lens 3 is slowly pressed into the second lens 3 through the recess 36 and the opening 37. Air in a cavity between the first lens surface 13 and the second lens surface 32 is exhausted completely when the first lens 1 is pressed into the second lens. Preferably, the assembled first lens 1 and second lens 3 are put into a pressure holding device for pressure holding. Preferably, the pressure holding is held for 1-20 seconds under 1-5 N.

In the photocuring step S5, assembled first lens 1 and second lens 3 are irradiated with a UV light source to cure the liquid quantum dot fluorescent resin between the first lens surface 13 and the second lens surface 32. Preferably, irradiation of the UV light source lasts for 1-10 seconds.

The manufacturing method may further include a secondary encapsulating step S6. Specifically, after the photocuring step S5, irradiation is performed with a first laser beam for 0.5-1.0 seconds at a power of 250-300 W to form a molten pool on a surface of each of the first lens surface 13 and the second lens surface 32 in a laser operating region to volatilize an impurity or dissolve the impurity in the molten pool, thereby further improving the uniformity in the laser operating region, a spot area of the laser beam being greater than a projection area of the second lens surface 32 on the first lens 1. Irradiation is performed with a second laser beam for 0.4-0.6 seconds at a power of 500-800 W and a defocusing distance of 3 mm to further expand the molten pool, thus eliminating a gap and volatilizing gas in the gap. Through the secondary encapsulating step S6, the quantum dot lens is combined more tightly to achieve the water resistance and oxygen resistance. With two laser beams at different powers for melting, while the encapsulation quality is ensured, the overflown quantum dot fluorescent resin is eliminated by heating, the doped air is removed, and the molten surface is purer and smoother. Therefore, the better light transmittance and more uniform light diffusion are achieved.

The above described are merely preferred embodiments of the present disclosure and are not intended to limit the present disclosure in any form. Any simple changes, equivalent variations and modifications made to the above embodiments based on the technical essence of the present disclosure should fall within the scope defined by the technical solutions of the present disclosure.

What is claimed is:

1. A manufacturing method of a quantum dot lens, wherein
the quantum dot lens comprises a first lens and a second lens, the first lens comprises a lens portion and a lug boss under the lens portion, a diameter of the lug boss is greater than a maximum diameter of the lens portion, the second lens comprises a lens body and a base, the lens body is provided with a concave second lens surface, the base is provided under the lens body, a recess is formed in an underside of the base, and an opening is formed in a portion of the recess corresponding to the concave second lens surface; and
the lens portion of the first lens is stretched into the second lens through the recess and the opening, and the lug boss of the first lens is stretched into the recess; and
the manufacturing method comprises the following steps:
a lens injection molding step S1, a laser etching step S2, a quantum dot fluorescent resin injecting step S3, an encapsulating and pressure holding step S4, and a photocuring step S5, specifically:
in the lens injection molding step S1, high-temperature injection molding is performed with a prefabricated mold and a specified optical resin material to respectively manufacture the first lens and the second lens;
in the laser etching step S2, laser etching is performed on a portion where an upper surface of the lug boss of the first lens contacts a lower surface of the recess of the second lens to form overflow lines for overflowing quantum dot fluorescent resin;

in the quantum dot fluorescent resin injecting step S3, the concave second lens surface of the second lens is placed upward, and an appropriate amount of liquid quantum dot fluorescent resin is coated on the concave second lens surface;

in the encapsulating and pressure holding step S4, the lens portion of the first lens toward the second lens is slowly pressed into the second lens through the recess and the opening, wherein air in a cavity between a first lens surface and the concave second lens surface is exhausted completely when the first lens is pressed into the second lens; and the first lens and the second lens after assembling are put into a pressure holding device for pressure holding, wherein the pressure holding is held for 1-20 seconds under 1-5 N; and in the photocuring step S5, the first lens and the second lens after assembling are irradiated with an ultraviolet (UV) light source to cure the liquid quantum dot fluorescent resin between the first lens surface and the concave second lens surface, wherein the irradiation of the UV light source lasts for 1-10 seconds; and the manufacturing method further comprises a secondary encapsulating step S6, specifically: after the photocuring step S5, first irradiation is performed with a first laser beam for 0.5-1.0 seconds at a power of 250-300 W to form a molten pool on a surface of each of the first lens surface and the concave second lens surface in a laser operating region, wherein an impurity is volatilized or dissolved in the molten pool, and a spot area of the laser beam is greater than a projection area of the concave second lens surface on the first lens; and second irradiation is performed with a second laser beam for 0.4-0.6 seconds at a power of 500-800 W and a defocusing distance of 3 mm, and the molten pool is further expanded to eliminate a gap and volatilize a gas in the gap.

2. A quantum dot lens, obtained by the manufacturing method according to claim 1,
wherein:
the first lens is a convex lens and the first lens is provided with the first lens surface;

the second lens is a concave lens and the second lens is provided with the concave second lens surface opposite to the first lens surface;

a quantum dot fluorescent resin layer is provided between the first lens surface and the concave second lens surface, and the quantum dot fluorescent resin layer comprises more than one quantum dot fluorescent material; and irregular concave and convex points are arranged on the first lens surface and the concave second lens surface, and the irregular concave and convex points are formed into at least one of a diffused micro-pyramid, a circular shape or an elliptical shape.

3. A backlight module, comprising:
the quantum dot lens according to claim 2; and
a light emitting diode (LED) light source under the first lens of the quantum dot lens.

4. The backlight module according to claim 3, wherein
the first lens surface of the first lens and the concave second lens surface of the second lens are spaced apart at a fixed distance.

5. The backlight module according to claim 4, wherein
a conical recess is formed in an upside of the lens body of the second lens, and a surface of the conical recess serves as a backlight outgoing surface.

6. A display device, comprising:
a display panel;
the quantum dot lens according to claim 2; and
a light-emitting diode (LED) light source under the first lens of the quantum dot lens.

7. The display device according to claim 6, wherein
the first lens surface of the first lens and the concave second lens surface of the second lens are spaced apart at a fixed distance.

8. The display device according to claim 7, wherein
a conical recess is formed in an upside of the lens body of the second lens, and a surface of the conical recess serves as a backlight outgoing surface.

9. The quantum dot lens according to claim 2, wherein
the first lens surface of the first lens and the concave second lens surface of the second lens are spaced apart at a fixed distance.

10. The quantum dot lens according to claim 9, wherein
a conical recess is formed in an upside of the lens body of the second lens, and a surface of the conical recess serves as a backlight outgoing surface.

* * * * *